United States Patent [19]
Maier et al.

[11] Patent Number: 4,590,611
[45] Date of Patent: May 20, 1986

[54] TUNER FOR COMMUNICATIONS EQUIPMENT

[75] Inventors: Gerhard Maier, Dauchingen; Joachim Lange, Villingen-Schwenningen, both of Fed. Rep. of Germany

[73] Assignee: Deutsche Thomson-Brandt GmbH, Villingen, Fed. Rep. of Germany

[21] Appl. No.: 575,522

[22] Filed: Jan. 31, 1984

[30] Foreign Application Priority Data

Feb. 4, 1983 [DE] Fed. Rep. of Germany ....... 3303711

[51] Int. Cl.⁴ .............................. H03J 7/20; H04B 1/18
[52] U.S. Cl. ..................................... 455/166; 455/183; 455/186
[58] Field of Search ............... 455/186, 185, 183, 166, 455/161, 179

[56] References Cited

U.S. PATENT DOCUMENTS 4,334,323 6/1982 Moore ................................. 455/186
4,430,753 2/1984 Shiratani ............................. 455/166

FOREIGN PATENT DOCUMENTS 0000633 1/1980 Japan ................................ 455/183

Primary Examiner—Marc E. Bookbinder
Assistant Examiner—Andrew J. Telesz, Jr.
Attorney, Agent, or Firm—Horst M. Kasper

[57] ABSTRACT

An tuner unit is provided for communications receivers with automatic self-balancing of the individual high frequency filter circuits. An assigned frequency applied to the desired receiver channel is fed to the antenna input during the automatic balancing process. The voltage of this assigned frequency picked up at the output of the filter circuits changes according to a stepwise increase of a tuning voltage controlled by a microprocessor. The tuning voltage is applied to the filter circuit to be balanced via a digital-analog converter and via a switching means controlled by the microprocessor. The automatic balancing is provided by switching the switching means successively to connect to the individual filter sections.

10 Claims, 1 Drawing Figure

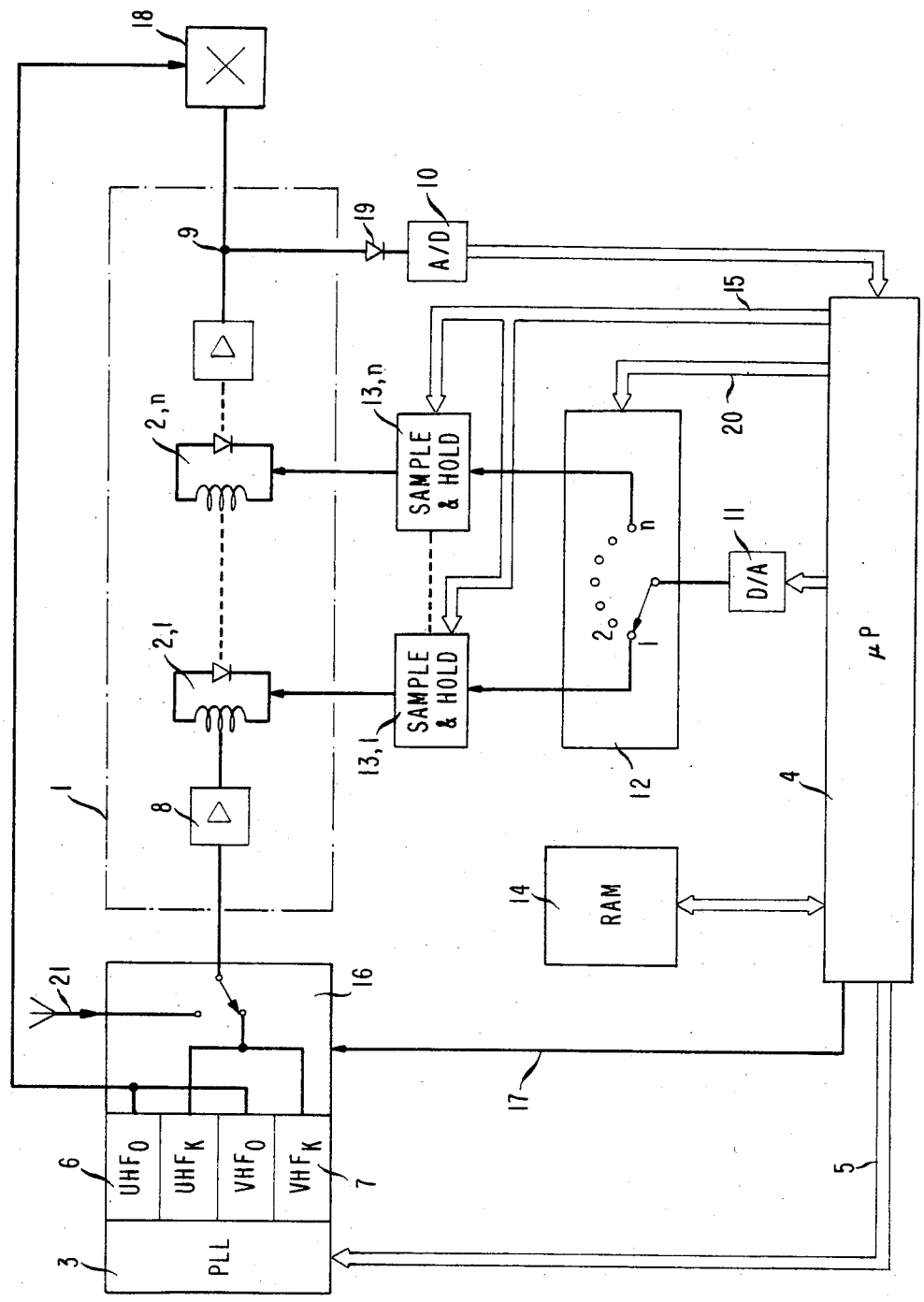
FIG. I

TUNER FOR COMMUNICATIONS EQUIPMENT

BACKGROUND OF THE INVENTION

1. Field of the Invention

The present invention relates to a tuner unit for communications apparatus and in particular to television and radio receivers employing a phase locked looped system which upon tuning of the receiver apparatus successively tunes the individual tuning circuits to the frequency generated by the phase locked loop and which retains the tuning voltages of the individual filter circuits obtained in this manner.

2. Brief Description of the Background of the Invention Including Prior Art

The German Patent Application Laid Open DE-OS 28 54 852 teaches such a tuning unit for example, which tunes the high frequency circuits to the desired receiver frequency with three auxiliary oscillators and corresponding analog storage units using a phase locked loop circuit (PLL-circuit). Auxiliary oscillators are required corresponding to the number of high frequency circuits to be balanced. The number of the auxiliary oscillators required and thus the material expenditures are increased particularly if in case of a television receiver the band I, band III and the bands IV and V are to be balanced. There exists the danger of ambiguities between the frequencies of tuner oscillator, of the auxiliary oscillators and of the receiver frequencies. It is disadvantageous for a practical realization of the known tuning units that the exciting windings of the individual auxiliary oscillators can cause undesired resonances and damping of the circuits in a reception case, which can also cause an uncontrolled detuning of the circuits, if the auxiliary oscillators are to be switched off after performed balancing.

A tuning method for radio receivers is taught in the journal "Nachrichten elektronik" Issue 11/79, pages 365 to 368, which also employs additional auxiliary circuits in the high frequency filters. Here again disadvantageous interferences of the circuits result during operation of the balanced receiver. As indicated on page 367 in the left and middle column, the precision of the tuning is achieved only based on exactly paired tuning diodes. This again requires an effort which cannot be neglected, since the tuning diodes have to be realized on the same chip.

SUMMARY OF THE INVENTION

1. Purposes of the Invention

It is an object of the present invention to achieve an automatically balancing self-adjustment of communication receivers without having to select component parts.

It is another object of the present invention to obtain a maximum signal amplitude at the output of the receiver unit to be tuned.

It is a further object of the invention to be able to set an optimum, that is a symmetrical selection of filters at all receiver channels without engaging the high frequency receiver unit.

These and other objects and advantages of the present invention will become evident from the description which follows.

2. Brief Description of the Invention

The present invention provides an electronic tuning circuit for communications equipment such as radio and television sets, which comprises an antenna for receiving electromagnetic communication signals, an antenna input connecting the antenna, a phase-locked loop tuning system, a switching means which in each case of a selection of a receiver channel connects an assigned frequency to its output and which otherwise connects the antenna input to its output, high frequency filter circuits connected to the output of the switching means, a rectifying means connected to the output of the high frequency filter circuits having an output, a microprocessor connected to the output of the rectifying means and having an output connected to the phase locked loop tuning system, a digital-analog converter having an input connected to an output of the microprocessor and having an output, a switching means having an input connected to the output of the microprocessor and output provisions, and an intermediate memory storage having an input connected to the output of the switching means and having an output connected to the high frequency filter circuits.

The microprocessor can increase step by step a tuning value until a maximum value of the measurement voltage is reached at the point of measurement at the output of the high frequency filter circuits. The intermediate memory storage can provide the tuning voltages for the tuning diodes. The tuning values can be applied to the intermediate storage via a single switch controlled by the digital-analog converter and the microprocessor and where after optimum tuning of a filter circuit the output of the digital-analog converter is connected to a following intermediate memory storage section. A memory unit can be connected to the microprocessor for storing the tuning values for the individual filter circuit sections as digital words. Means for cyclically refreshing the memory unit can be connected to the memory unit.

There is also provided a method for tuning electronic communications receivers such as radios and television sets. A phase locked loop system is employed for tuning. An assigned frequency is fed to the antenna input upon selection of a receiver channel. The frequency is filtered in a high frequency filter section. The output of the high frequency filter section is rectified and the rectified voltage is fed to an analog-digital converter. The output signal of the analog-digital converter is entered in a microprocessor. The tuning value is increased step by step in the microprocessor until a maximum voltage is reached at the output of the rectifying unit. Individual output signals of the microprocessor are fed to a switching means via an digital-analog converter and from the switching means successively to an intermediate memory storage. Tuning voltages are fed from the intermediate memory storage sections to tuning diodes disposed in the filter circuit. The output of the analog-digital converter is connected via the switching means to the next following intermediate memory storage after optimum tuning of a filter circuit section.

Digital words can be stored in a memory unit connected to the microprocessor, which digital words represent the tuning values for the individual high frequency filter sections. The intermediate memory storage can be cyclically refreshed.

The present invention provides the advantage that only a single analog-digital converter is employed for the tuning voltages of all filters to be balanced and the digital-analog converter in connection with economical analog intermediate storage devices simplifies considerably the construction of a self-balancing tuning system.

The novel features which are considered as characteristic for the invention are set forth in the appended claims. The invention itself, however, both as to its construction and its method of operation, together with additional objects and advantages thereof, will be best understood from the following description of specific embodiments when read in connection with the accompanying drawing.

BRIEF DESCRIPTION OF THE DRAWING

In the accompanying drawing, in which are shown several of the various possible embodiments of the present invention:

The sole FIGURE is a view of a schematic diagram representing the high frequency receiver apparatus circuit of for example a television receiver.

DESCRIPTION OF INVENTION AND PREFERRED EMBODIMENTS

In accordance with the present invention there is provided an electronic tuning unit for communications apparatus, and in particular for television and radio receiver sets with a phase locked loop (PLL) tuning system. In each case upon selection of a receiver channel an assigned frequency is connected to the antenna input, which is connected to a computer unit as taken at the output of the high frequency or radio frequency circuits as a rectified voltage via an analog-digital converter. The computer increases the tuning value step by step until a maximum value of the measured voltage is reached at the measurement point. Analog intermediate memory storage devices are provided for delivering the tuning voltages for the tuning diodes connected in the filter circuits. The individual tuning values are applied successively to an intermediate memory storage device 13,x via a single digital-analog converter 11 and a switch 12 controlled by a computer 4, where under control of the computer 4 the output of the digital-analog converter 11 is connected to the next following intermediate memory storage section 13,x 1 via the switch 12 upon optimal tuning of a filter circuit 12,x.

A memory storage 14 can be provided in the computer unit 4 and digital words representing tuning values for the individual filters 2,1 to 2,n are stored in the memory storage 14. A cyclical refresh cycle can be provided at timed intervals to the intermediate memory storage 13,1 to 13,n.

The high frequency receiver apparatus 1 is provided with filter circuits 2,1 to 2,n for filtering of the receiver frequencies. The receiver apparatus is provided with a tuning unit for channels in the ultra high frequency (UHF) and the very high frequency (VHF) region. The tuning is performed with the aid of a frequency synthesizer for providing the desired frequency, where the oscillator frequency is generated for tuning of the apparatus with the aid of a phase locked loop circuit 3. This circuit for tuning of a receiver apparatus is known. The phase locked loop is set to the desired oscillator frequency by changing the divider ratio of a programmable divider disposed in the phase locked loop. The divider ratio is entered in coded form via a channel selection unit and is fed as a data word from a computer unit 4 via the data transmission conduit 5 of the phase locked loop 3. Conventional logic circuitry would be employed to provide VHF UHF band oscillator selection in response to a "band selection type command" from the computer unit 4. It is a purpose of the invention to provide for automatic balancing of the receiver apparatus for each receiver channel. Therefore an assigned frequency from an assigned frequency oscillator 6 or 7 is connected to the input of the receiver apparatus upon entering of the receiver channel via the phase locked loop circuit 3. This is performed via switching of a switching stage 16 with the aid of a control signal provided by the computer unit 4 via conduit 17, which switches from the frequency of the receiver oscillator to the assigned frequency K. This assigned frequency corresponding to the middle frequency of the channel to be received passes after amplification in a stage 8 to the filters 2,1 to 2,n and to a circuit point 9, which, for example, can be located at the input of the mixing stage 18. The voltage present at this point of the frequency K is rectified by the rectifier 19. Preferably, the rectifier 19 is a semiconductor diode. This direct voltage is transformed by an analog to digital converter 10 to a digital value, which corresponds to the measurement voltage at the point 9.

The balancing of the individual filters is provided as follows:

The digital to analog converter 11 is controlled by the computer unit 4 with a digital word such that for example a lower tuning voltage occurs. This lower tuning voltage results for example from the upper tuning voltage by dividing through the maximum number of steps of the digital-analog converter employed. In case of a digital analog converter with 6 bit the step number is 64. This lower tuning voltage is applied initially in analog form via the contact 12,1 of a switch 12 to the intermediate memory storage 13,1 and thus to the first filter circuit 2,1 to be balanced. A measurement voltage results at the measurement point 9, which is transformed into a digital value after rectification by the rectifier 19 with the analog-digital converter 10 and it is retained in the computer unit 4. Then the digital tuning value is increased by a step with the aid of the computer unit 4 and the new tuning value passes via the digital/analog converter 11 and the contact 12,1 of the switch 12 again to the first filter circuit 2,1. This tuning results in a changed measurement value at the measurement point 9. If this measurement value goes up in a positive direction then the computer unit 4 increases the digital tuning value by another step such that the analog tuning voltage also increases via the digital-analog converter 11 until the maximum voltage value is reached at the point 9. This is a criteria for the situation that the first filter 2,1 is optimally balanced.

The corresponding tuning voltage value is recorded in a memory storage address of the memory storage 14. A further connection of the switch 12 to the contact 12,2 is now effected by the computer 4 control via a control line 20. Now the same stepwise balancing is provided for the filter 2,2 until the optimum balancing is also present for this filter. The tuning value determined is placed into the next address of the memory storage 14. This method is continued until the last filter 2,n is balanced. The analog intermediate memory storage sections 13 are activated for accepting the data applied via a control line 15. Since the analog intermediate storage units 13 are short term memory storage units, they are cyclically refreshed via the computer control and thus the balancing of the receiver during operation is maintained without that the assigned frequencies employed during the first balancing have to be activated again. Capacitors and sample-and-hold circuits are suitable as analog intermediate storage elements and such elements are economically very favorable for the present technology. They maintain the tuning value up to the refresh cycle in a sufficient way, since the tuning diodes of the tuning circuits have a relatively high resistance. The assigned oscillator UHF K or, respectively, VHF K is switched off. Then the input of the receiver apparatus 1 is connected to the antenna 21. The oscillator frequencies UHF 0 or, respectively, VHF 0 are applied to the mixing stage 18 for the generation of the intermediate frequency to be further processed, which is formed from the difference of the oscillator frequency and of the input frequency.

It will be understood that each of the elements described above, or two or more together, may also find a useful application in other types of frequency selection system configurations and receiver signal processing procedures differing from the types described above.

While the invention has been illustrated and described as embodied in the context of a tuner for communications equipment, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. An electronic tuning unit for communications equipment such as radio and television sets comprising
    an antenna for receiving electromagnetic communication signals;
    an antenna input connected to the antenna;
    a phase-locked loop tuning system for generating an oscillator frequency for tuning an apparatus separately wherein a desired oscillator frequency of the phase locked loop is varied by changing the divider ratio of a programmable divider disposed in the phaselocked loop;
    a first switching means which in each case of a selection of a receiver channel connects an assigned frequency to its output and which otherwise connects the antenna input to its output;
    high frequency filter circuits connected to the output of the first switching means;
    a rectifying means connected to the output of the high frequency filter circuits having an output;
    a microprocessor connected to the output of the rectifying means and having an output connected to the phase locked loop tuning system;
    a digital-analog converter having an input connected to an output of the microprocessor and having an output;
    a second switching means having an input connected to the output of the microprocessor via said digital to analog converter and having output provisions for feeding a controlled analog signal corresponding to a microprocessor output; and
    an intermediate memory storage having an input connected to the output provisions of the second switching means and having an output connected to the high frequency filter circuits.

2. The electronic tuning unit for communications equipment according to claim 1 wherein the microprocessor increases step by step a tuning value until a maximum value of a measurement voltage is reached at a point of measurement at the output of the high frequency filter circuits.

3. The electronic tuning unit for communications equipment according to claim 1 wherein the intermediate memory storage provides tuning voltages for tuning diodes.

4. The electronic tuning unit for communications equipment according to claim 1 wherein tuning values are applied to the intermediate storage via a single switch controlled by the digital-analog converter and the microprocessor and where after optimum tuning of a filter circuit the output of the digital-analog converter is connected to a following intermediate memory storage section.

5. The electronic tuning unit for communications equipment according to claim 1 further comprising
    a memory unit connected to the microprocessor for storing tuning values for the individual filter circuit sections as digital words.

6. The electronic tuning unit for communications equipment according to claim 1 further comprising
    means for cyclically refreshing a memory unit, which is connected to the memory unit.

7. A method for tuning electronic communications receivers such as radios and television sets comprising
    phase-locking a local oscillator to an input frequency for tuning to a desired input signal;
    feeding an assigned frequency to an antenna input upon selection of a receiver channel;
    filtering a frequency coming from the antenna input in a high frequency filter circuit section;
    rectifying the output of the high frequency filter circuit section;
    feeding the rectified voltage to an analog-digital converter;
    entering the output signal of the analog-digital converter in a microprocessor;
    increasing a tuning value step by step in the microprocessor until a maximum voltage is reached at the output of the rectifying unit;
    feeding individual output signals of the microprocessor to a switching means via an digital-analog converter and from the switching means successively to an intermediate memory storage unit of a sequence of such units;
    feeding tuning voltages from the intermediate memory storage sections to tuning diodes disposed in the high frequency filter circuit section; and
    connecting the output of the digital-analog converter via the switching means to a next following intermediate memory storage unit after optimum tuning of a high frequency filter circuit section.

8. The method for tuning electronic communications receivers according to claim 7 further comprising
    storing digital words in a memory unit connected to the microprocessor, which digital words represent tuning values for the individual high frequency filter sections.

9. The method for tuning electronic communications receivers according to claim 7 further comprising
    cyclically refreshing the intermediate memory storage.

10. The method for tuning electronic communications receivers according to claim 7 further comprising
    mixing an output from the high frequency filter circuit section in a mixer stage.

* * * * *